(12) United States Patent
Mun et al.

(10) Patent No.: US 11,502,193 B2
(45) Date of Patent: Nov. 15, 2022

(54) EXTENDED-DRAIN METAL-OXIDE-SEMICONDUCTOR DEVICES WITH A MULTIPLE-THICKNESS BUFFER DIELECTRIC LAYER

(71) Applicant: GLOBALFOUNDRIES Singapore Pte. Ltd., Singapore (DE)

(72) Inventors: Bong Woong Mun, Singapore (SG); Upinder Singh, Singapore (SG); Jeoung Mo Koo, Singapore (SG)

(73) Assignee: GlobalFoundries Singapore Pte. Ltd., Singapore (SG)

( * ) Notice: Subject to any disclaimer, the term of this patent is extended or adjusted under 35 U.S.C. 154(b) by 54 days.

(21) Appl. No.: 17/019,836

(22) Filed: Sep. 14, 2020

(65) Prior Publication Data
US 2022/0085211 A1    Mar. 17, 2022

(51) Int. Cl.
*H01L 29/78*    (2006.01)
*H01L 29/423*    (2006.01)
*H01L 29/06*    (2006.01)
*H01L 29/66*    (2006.01)

(52) U.S. Cl.
CPC ...... *H01L 29/7824* (2013.01); *H01L 29/0649* (2013.01); *H01L 29/42368* (2013.01); *H01L 29/66681* (2013.01)

(58) Field of Classification Search
CPC ......... H01L 29/66681; H01L 29/66689; H01L 29/42368; H01L 29/7816
See application file for complete search history.

(56) References Cited

U.S. PATENT DOCUMENTS

| 8,138,049 | B2 | 3/2012 | You |
| 8,525,257 | B2 | 9/2013 | Alter et al. |
| 8,969,962 | B2 * | 3/2015 | Chan ............... H01L 29/513 438/270 |
| 9,412,667 | B2 | 8/2016 | Chou et al. |
| 9,871,133 | B2 | 1/2018 | Ng et al. |

(Continued)

OTHER PUBLICATIONS

H. -. Lee et al., "Implementation of High Power RF Devices with Hybrid Workfunction and OxideThickness in 22nm Low-Power FinFET Technology," 2019 IEEE International Electron Devices Meeting (IEDM), San Francisco, CA, USA, 2019, pp. 25.4.1-25.4. 4, doi: 10.1109/IEDM19573.2019.8993647.

*Primary Examiner* — Raj R Gupta
(74) *Attorney, Agent, or Firm* — Thompson Hine LLP; Francois Pagette

(57) ABSTRACT

Structures for an extended-drain metal-oxide-semiconductor device and methods of forming a structure for an extended-drain metal-oxide-semiconductor device. First and second source/drain regions are formed in a substrate, and a gate electrode is formed over the substrate. The gate electrode has a sidewall, and the gate electrode is laterally positioned between the first source/drain region and the second source/drain region. A buffer dielectric layer is formed that includes a first dielectric layer having a first portion positioned between the substrate and the gate electrode. The dielectric layer also has a second portion positioned on the substrate laterally between the sidewall of the gate electrode and the first source/drain region. The first portion of the dielectric layer has a first thickness, and the second portion of the first dielectric layer has a second thickness that is less than the first thickness.

20 Claims, 4 Drawing Sheets

(56) References Cited

U.S. PATENT DOCUMENTS

| | | |
|---|---|---|
| 2008/0157203 A1 | 7/2008 | Shin |
| 2010/0013012 A1 | 1/2010 | Cai |
| 2016/0190269 A1 | 6/2016 | Brown et al. |
| 2020/0091340 A1* | 3/2020 | Snyder ................ H01L 29/7824 |

* cited by examiner

EXTENDED-DRAIN METAL-OXIDE-SEMICONDUCTOR DEVICES WITH A MULTIPLE-THICKNESS BUFFER DIELECTRIC LAYER

BACKGROUND

The invention relates generally to semiconductor device and integrated circuit fabrication and, more specifically, to structures for an extended-drain metal-oxide-semiconductor device and methods of forming a structure for an extended-drain metal-oxide-semiconductor device.

High-voltage integrated circuits used, for example, in microwave/RF power amplifiers typically require specialized circuit technology capable of withstanding higher voltages. Extended-drain metal-oxide-semiconductor (EDMOS) devices, also known as laterally-diffused metal-oxide-semiconductor (LDMOS) devices, are designed to handle such higher voltages by incorporating additional transistor features, such as an extended drain, that promote the higher voltage handling capability. However, elevated drain voltages make an extended-drain metal-oxide-semiconductor device highly susceptible to damage caused by hot-carrier injection. The damage caused by hot-carrier injection may degrade the linear drain current. Consequently, the ability to use an extended-drain metal-oxide-semiconductor device in automotive applications, as well as other applications, may be restricted.

Improved structures for an extended-drain metal-oxide-semiconductor device and methods of forming an extended-drain metal-oxide-semiconductor device are needed.

SUMMARY

In an embodiment, a structure for an extended-drain metal-oxide-semiconductor device is provided. The structure includes first and second source/drain regions in a substrate, and a gate electrode over the substrate. The gate electrode has a sidewall, and the gate electrode is laterally positioned between the first source/drain region and the second source/drain region. A buffer dielectric layer is formed that includes a dielectric layer having a first portion positioned between the substrate and the gate electrode. The dielectric layer also has a second portion positioned on the substrate laterally between the sidewall of the gate electrode and the first source/drain region. The first portion of the dielectric layer has a first thickness, and the second portion of the dielectric layer has a second thickness that is less than the first thickness.

In an embodiment, a method of forming a structure for an extended-drain metal-oxide-semiconductor device is provided. The method includes forming a dielectric layer of a buffer dielectric layer on a substrate, forming a gate electrode over the substrate that covers a first portion of the dielectric layer, thinning a second portion of the dielectric layer adjacent to a sidewall of the gate electrode, and forming a first source/drain region and a second source/drain region in the substrate. The gate electrode is laterally positioned between the first source/drain region and the second source/drain region, and the second portion of the first dielectric layer is positioned on the substrate laterally between the gate electrode and the first source/drain region. The first portion of the dielectric layer has a first thickness, and the second portion of the dielectric layer has a second thickness that is less than the first thickness.

BRIEF DESCRIPTION OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention. In the drawings, like reference numerals are used to indicate like features in the various views.

DETAILED DESCRIPTION

Figure 1:
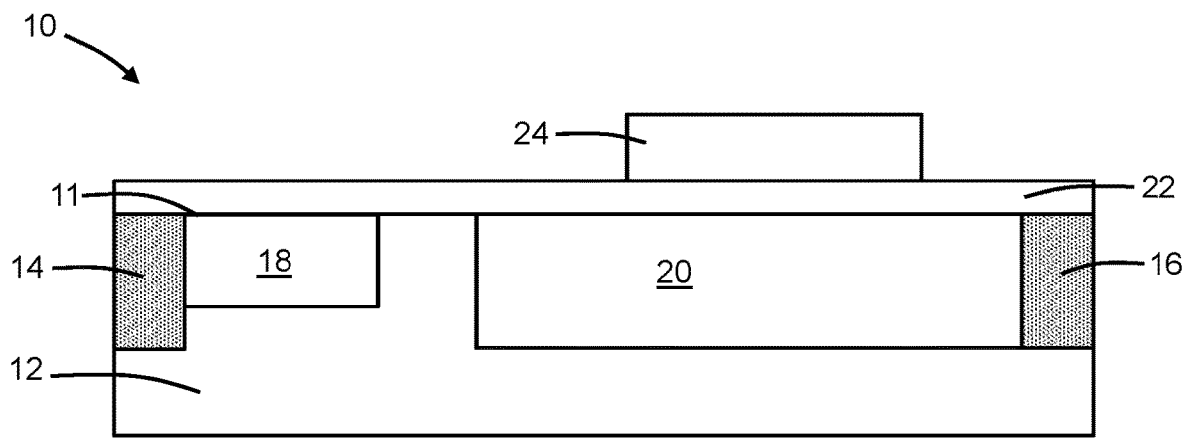
FIG. 1 is a cross-sectional view of a structure at an initial fabrication stage in accordance with embodiments of the invention.

With reference to FIG. 1 and in accordance with embodiments of the invention, a structure 10 for an extended-drain metal-oxide-semiconductor device includes a substrate 12 and trench isolation regions 14, 16 arranged in the substrate 12 to surround an active region. The substrate 12 may be comprised of a single-crystal semiconductor material, such as single-crystal silicon, and may be lightly doped to have p-type conductivity. The trench isolation regions 14, 16 may be formed by defining shallow trenches in the substrate 12 with lithography and etching processes, depositing a dielectric material to fill the shallow trenches, and planarizing and/or recessing the dielectric material. The dielectric material comprising the trench isolation regions 14, 16 may be silicon dioxide and/or another electrical insulator deposited by chemical vapor deposition.

Wells 18, 20 are formed in the active region of the substrate 12. The wells 18, 20 intersect different portions of a top surface 11 of the substrate 12 and a portion of the substrate 12 is positioned between the well 18 and the well 20. The well 18 is comprised of a semiconductor material doped to have a conductivity type of an opposite polarity from the conductivity type of the semiconductor material of the well 20. The well 18 may be formed by introducing a dopant by, for example, ion implantation with given implantation conditions into the substrate 12. The well 20 may be formed by introducing a different dopant of opposite conductivity type by, for example, ion implantation into the substrate 12. A patterned implantation mask may be formed to define a selected area on the top surface 11 that is exposed for each individual implantation. The implantation masks cover different areas on the top surface 11 in order to determine, at least in part, the location and horizontal dimensions of the wells 18, 20. Each implantation mask may include a layer of a material, such as an organic photoresist, that is applied and patterned such that areas on the top surface 11 are covered and masked. Each implantation mask has a thickness and stopping power sufficient to block the masked areas against receiving a dose of the implanted ions.

The implantation conditions (e.g., ion species, dose, kinetic energy) may be selected to tune the electrical and physical characteristics of the well 18. A separate set of implantation conditions (e.g., ion species, dose, kinetic energy) may be selected to tune the electrical and physical characteristics of the well 20. In an embodiment in which the substrate 12 has p-type conductivity, the well 18 may contain semiconductor material doped with an n-type dopant (e.g., phosphorus and/or arsenic) to provide n-type conductivity, and the well 20 may contain semiconductor material doped with a p-type dopant (e.g., boron) to provide p-type conductivity.

A dielectric layer 22 is deposited over the top surface 11 of the substrate 12 and the trench isolation regions 14, 16, and then patterned by lithography and etching processes. In an embodiment, the dielectric layer 22 may be comprised of silicon dioxide. In an embodiment, the dielectric layer 22 may be comprised of high-temperature silicon dioxide formed by thermal oxidation.

An etch mask 24 may be formed by a lithography process on the dielectric layer 22 at a position that is located over a portion of the well 20. The etch mask 24 may comprise an organic photoresist applied by a spin coating process, pre-baked, exposed to light projected through a photomask, baked after exposure, and developed with a chemical developer to define a shape at an intended location on the dielectric layer 22.

Figure 2:
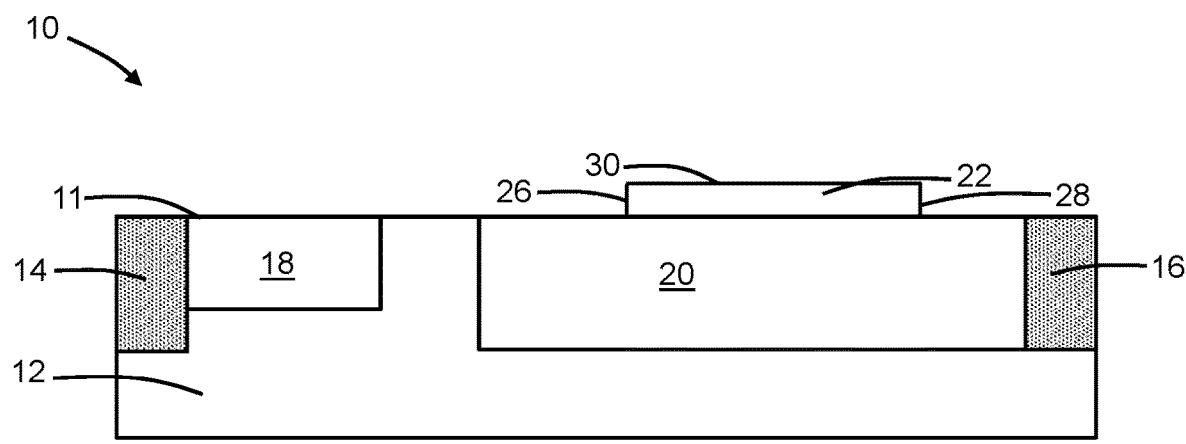
FIGS. 2-6 are cross-sectional views of the structure at successive fabrication stages subsequent to FIG. 1.

With reference to FIG. 2 in which like reference numerals refer to like features in FIG. 1 and at a subsequent fabrication stage of the processing method, the dielectric layer 22 is etched by an etching process with the etch mask 24 present. The etching process may be a reactive ion etching process, and a residual portion of the dielectric layer 22 beneath the shape of the etch mask 24 is protected during the reactive ion etching process. The etch mask 24 is stripped following the conclusion of the etching process. The residual portion of the dielectric layer 22 is located over a portion of the well 20.

The dielectric layer 22 has opposite sidewalls or side surfaces 26, 28, a top surface 30 that extends from one side surface 26 to the opposite side surface 28, and a bottom surface opposite to the top surface 30. The bottom surface of the dielectric layer 22 is in contact with the top surface 11 of the substrate 12 and, in an embodiment, the bottom surface of the dielectric layer 22 may be in direct contact with the top surface 11 of the substrate 12. The dielectric layer 22 has a thickness, T1.

Figure 3:
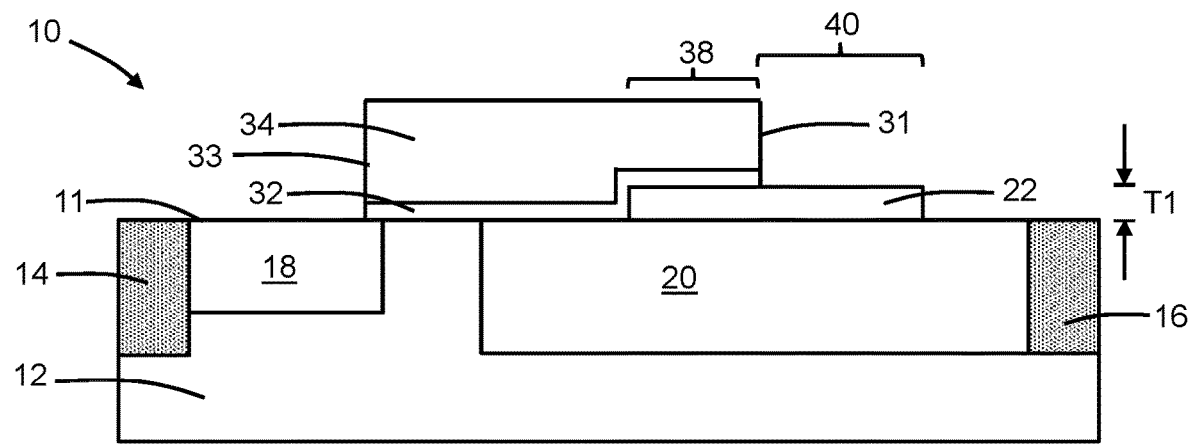

With reference to FIG. 3 in which like reference numerals refer to like features in FIG. 2 and at a subsequent fabrication stage of the processing method, a gate dielectric layer 32 and a gate electrode 34 are formed over the active region of the substrate 12. The gate dielectric layer 32 is comprised of a dielectric material, such as silicon dioxide, and the gate electrode 34 is comprised of a conductor, such as doped polysilicon. The gate electrode 34 and gate dielectric layer 32 may be formed by depositing a layer stack and patterning the layer stack with lithography and etching processes.

The gate electrode 34 may be positioned in part over the top surface 11 of the substrate 12 and positioned in part over the dielectric layer 22. In particular, a portion 38 of the dielectric layer 22 is covered by a portion of the gate electrode 34 and a portion 40 of the dielectric layer 22 is not covered by the gate electrode 34. The uncovered portion 40 of the dielectric layer 22 is positioned adjacent to a sidewall 31 of the gate electrode 34, which also has a sidewall 33 opposite to the sidewall 31.

Figure 4:
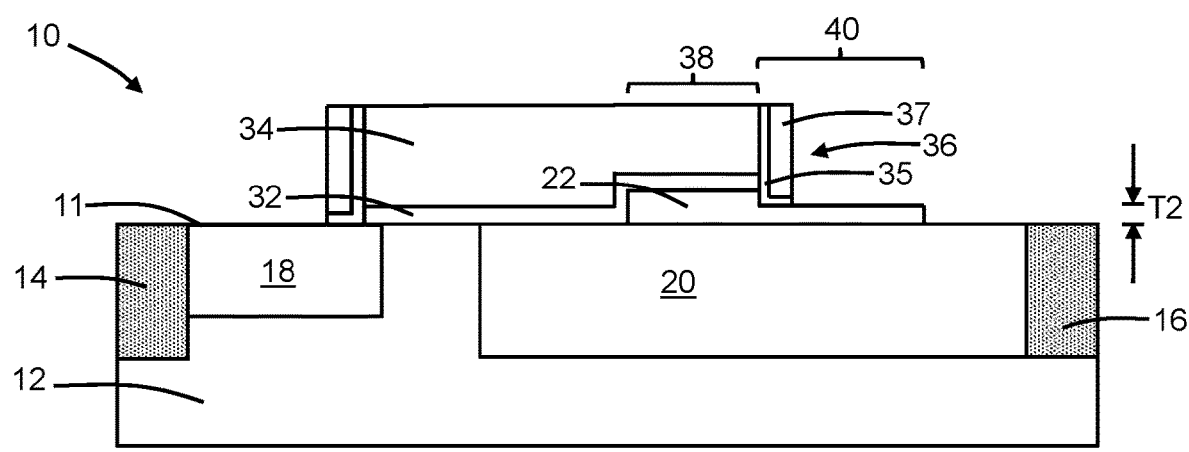

With reference to FIG. 4 in which like reference numerals refer to like features in FIG. 3 and at a subsequent fabrication stage of the processing method, the portion 40 of the dielectric layer 22 that is not covered by the gate electrode 34 is thinned by one or more etching and/or cleaning processes to have a thickness, T2, that is less than the thickness, T1. The portion 38 of the dielectric layer 22 that is covered by the gate electrode 34 is not thinned and retains its original thickness, T1. The thinned portion 40 is positioned adjacent to the sidewall 31 (FIG. 3) of the gate electrode 34.

A bilayer spacer 36 is then formed that extends about the periphery of the gate electrode 34. The bilayer spacer 36 may be formed by conformally depositing a layer stack of dielectric layers and etching the dielectric layers in the layer stack with a directional or anisotropic etching process, such as reactive ion etching. The bilayer spacer 36 may include an L-shaped dielectric layer 35 comprised of a dielectric material, such as silicon dioxide, and a dielectric layer 37 comprised of a different dielectric material, such as silicon nitride. A portion of the bilayer spacer 36 is positioned adjacent to the sidewall 31 of the gate electrode 34 on the thinned portion 40 of the dielectric layer 22 and between the sidewall 31 of the gate electrode 34 and the side surface 28 (FIG. 2) of the dielectric layer 22. A horizontal section of the dielectric layer 35 is positioned over and on the thinned portion 40 of the dielectric layer 22. In an embodiment, the horizontal section of the dielectric layer 35 may contain the same dielectric material (e.g., silicon dioxide) as the dielectric layer 22 and have a thickness that is additive to the thickness, T2, but less than the thickness, T1, when added to the thickness, T2. The horizontal section of the dielectric layer 35 may be positioned directly on the thinned portion 40 of the dielectric layer 22.

Figure 5:
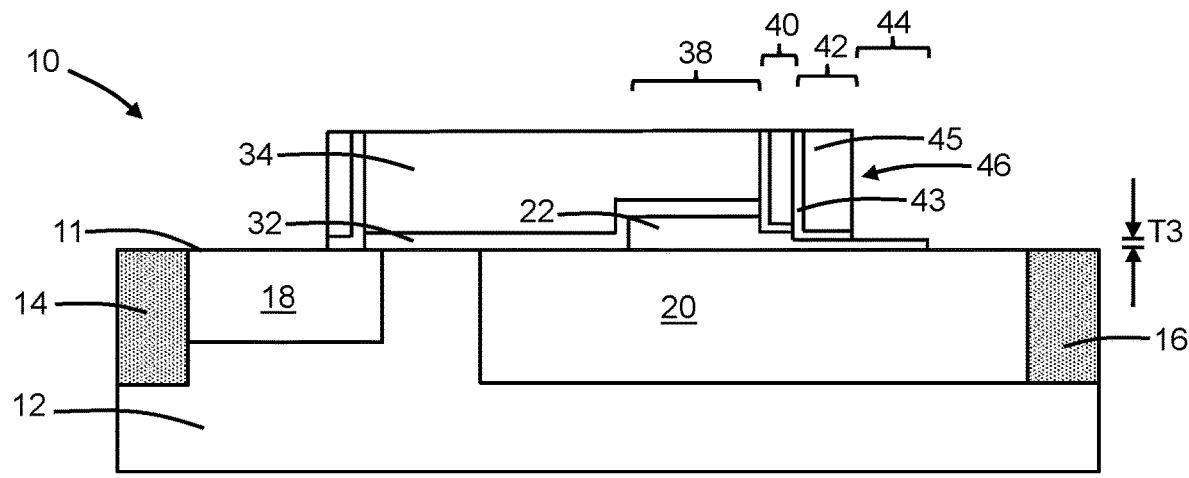

With reference to FIG. 5 in which like reference numerals refer to like features in FIG. 4 and at a subsequent fabrication stage of the processing method, portions 42, 44 of the dielectric layer 22 that are not covered by either the gate electrode 34 or the bilayer spacer 36 are thinned by one or more etching and/or cleaning processes to have a thickness, T3, that is less than the thickness, T1, and that is less than the thickness, T2. The portion 38 of the dielectric layer 22 that is covered by the gate electrode 34 is not thinned and retains its original thickness, T1. The portion 40 of the dielectric layer 22 that is covered by the bilayer spacer 36 is not further thinned and retains its original thickness, T2. The portion 40 of the dielectric layer 22 is positioned laterally between the portion 38 of the dielectric layer 22 and the portion 42 of the dielectric layer 22. The portion 44 of the dielectric layer 22 is laterally positioned between the portion 42 of the dielectric layer 22 and the side surface 28 of the dielectric layer 22.

A bilayer spacer 46 is then formed that extends about the periphery of the gate electrode 34 and the bilayer spacer 36. The bilayer spacer 36 is laterally positioned between the bilayer spacer 46 and the sidewall 31 of the gate electrode 34. The bilayer spacer 46 may be formed by conformally depositing a layer stack of dielectric layers and etching the dielectric layers in the layer stack with a directional or anisotropic etching process, such as reactive ion etching. A portion of the bilayer spacer 46 is positioned adjacent to the sidewall 31 of the gate electrode 34 on the thinned portion 42 of the dielectric layer 22 and between the bilayer spacer 36 and the side surface 28 (FIG. 2) of the dielectric layer 22. The thinned portion 44 of the dielectric layer 22 is not covered by the bilayer spacer 46.

The bilayer spacer 46 may include an L-shaped dielectric layer 43 comprised of a dielectric material, such as silicon dioxide, and a dielectric layer 45 comprised of a different dielectric material, such as silicon nitride. The dielectric layer 43 of the bilayer spacer 46 and the dielectric layer 35 of the bilayer spacer 36 may have approximately equal thicknesses, and the dielectric layer 45 of the bilayer spacer 46 may be thicker than the dielectric layer 37 of the bilayer spacer 36. A horizontal section of the dielectric layer 43 is positioned over and on the thinned portion 42 of the dielectric layer 22. The horizontal section of the dielectric layer 43 may be positioned directly on the thinned portion 42 of the dielectric layer 22. In an embodiment, the horizontal section of the dielectric layer 43 may contain the same dielectric material (e.g., silicon dioxide) as the dielectric layer 22 and have a thickness that is additive to the thickness, T3, but less than the thickness, T2, when added to the thickness, T3.

The different thicknesses of the portions 38, 40, 42, 44 of the dielectric layer 22 define a multiple-step buffer dielectric layer of the structure 10. An inner portion of the buffer dielectric layer may include the portion 38 of the dielectric layer 22 having the thickness, T1, which is the thickness of the dielectric layer 22 as originally deposited. The inner portion of the buffer dielectric layer is located on the top surface 11 of substrate 12 beneath the gate electrode 34 and the gate dielectric layer 32. The gate dielectric layer 32 is located only over the inner portion of the buffer dielectric layer.

A central portion of the buffer dielectric layer may include the portion 40 of the dielectric layer 22 having the thickness, T2. The central portion of the buffer dielectric layer is located beneath the bilayer spacer 36. In an embodiment, the central portion of the buffer dielectric layer may further include the section of the dielectric layer 35 of bilayer spacer 36 in addition to the central portion 40 of the dielectric layer 22 and may have a thickness greater than thickness, T2, but less than thickness, T1.

An outer portion of the buffer dielectric layer may include the portions 42, 44 of the dielectric layer 22 having the thickness, T3. The outer portion of the buffer dielectric layer is located between the bilayer spacer 36 and the side surface 28 of the dielectric layer 22. The bilayer spacer 46 is located on the outer portion of the buffer dielectric layer and, specifically, on the portion 42 of the dielectric layer 22 adjacent to the bilayer spacer 36. In an embodiment, the outer portion of the buffer dielectric layer may further include the section of the dielectric layer 43 of bilayer spacer 46 in addition to the portion 42 of the dielectric layer 22 and may have a thickness greater than thickness, T3, but less than thickness, T2. In this embodiment, the portion 44 of the dielectric layer 22 having the thickness, T3, may define an additional step in the buffer dielectric layer.

Figure 6:
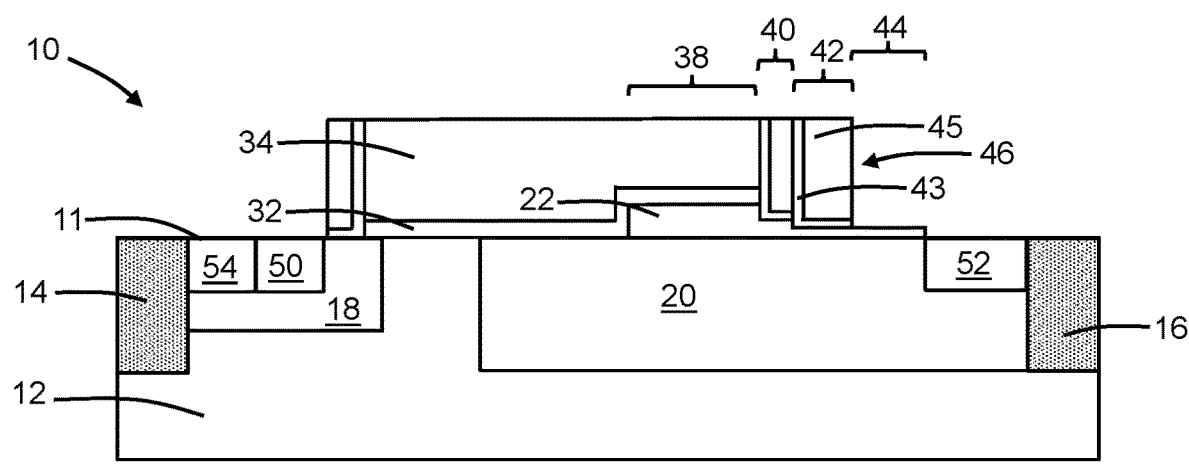

With reference to FIG. 6 in which like reference numerals refer to like features in FIG. 5 and at a subsequent fabrication stage of the processing method, doped regions 50, 52 and a doped region 54 are formed in the substrate 12. The doped regions 50, 52 may have a conductivity type of a polarity opposite to the conductivity type of the doped region 54. In an embodiment in which the well 18 has p-type conductivity and the well 20 has n-type conductivity, the semiconductor materials of the doped regions 50, 52 may be doped with an n-type dopant (e.g., phosphorus and/or arsenic) to provide n-type conductivity, and the semiconductor material of the doped region 54 may be doped with a p-type dopant (e.g., boron) to provide p-type conductivity. The doped regions 50, 52 may be formed by implanting ions (e.g., ions of the n-type dopant) with an implantation mask formed on the top surface 11 and defining the intended locations for the doped regions 50, 52 in the substrate 12. The doped region 54 may be formed by implanting ions (e.g., ions of the p-type dopant) with a different implantation mask formed on the top surface 11 and defining the intended location for the doped region 54 in the substrate 12.

The doped region 50, which is coupled to the well 18, is doped to have a conductivity type of a polarity opposite to the conductivity type of the well 18. The doped region 52, which is coupled to the well 20, is doped to have the same conductivity type as well 20 but at a higher dopant concentration than well 20. The doped region 54, which is also coupled to the well 18, is doped to have the same conductivity type as well 18 but at a higher dopant concentration than well 18.

The doped region 50 and the doped region 52 provide source/drain regions of the structure 10 for the extended-drain metal-oxide-semiconductor device. As used herein, the term "source/drain region" means a doped region of semiconductor material that can function as either a source or a drain of a field-effect transistor. In an embodiment, the doped region 50 may provide a source of the structure 10, and the doped region 52 may provide a drain of the structure 10.

Middle-of-line (MOL) processing and back-end-of-line (BEOL) processing follow, which includes formation of an interconnect structure coupled with the structure 10. In particular, a contact is formed that is coupled with the gate electrode 34, a contact is formed that is coupled with the doped regions 50 and 54, and a contact is formed that is coupled with the doped region 52.

The stepped buffer dielectric layer may promote a reduction in the drain voltage during operation. The susceptibility of the structure 10 to damage caused by ionization and hot-carrier injection is reduced by the lowering of the drain voltage. As a result, the structure 10 may exhibit reduced time-dependent degradation of the linear drain current (Idlin) due to the presence of the buffer dielectric layer, which may improve device reliability. The thicknesses of the steps in the buffer dielectric layer and the dimensions of the bilayer spacers 36, 46 may be used to optimize device performance.

Principles of the inventive embodiments may be illustrated by the following example.

Figure 7:
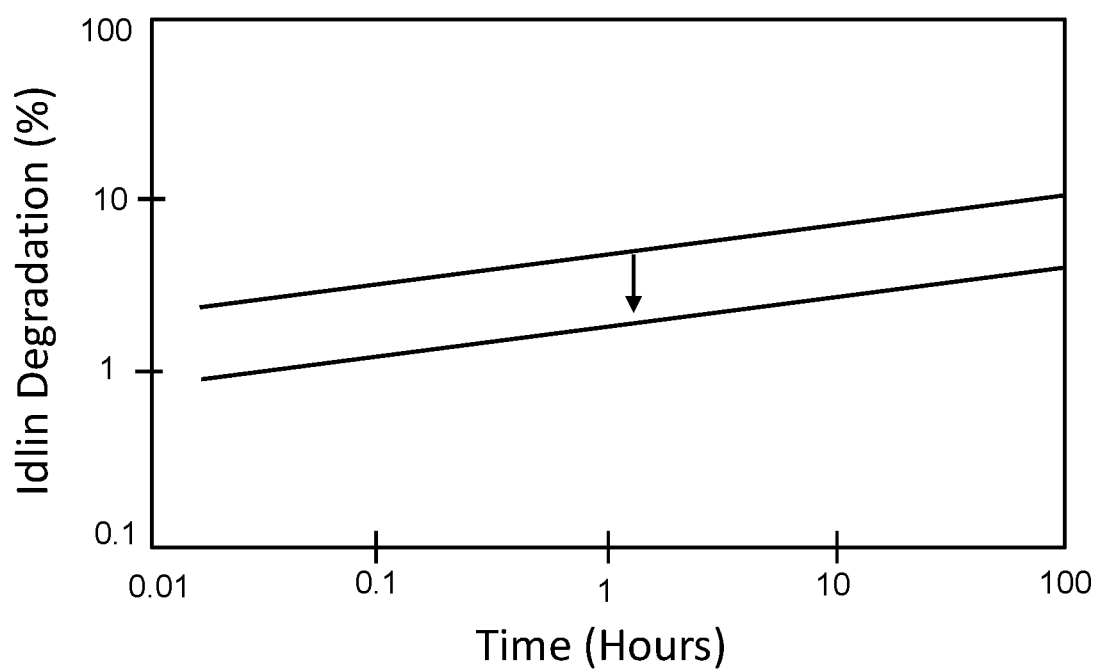
FIG. 7 is a log-log plot showing the improvement in the time-dependent degradation of the linear drain current for exemplary extended-drain metal-oxide-semiconductor devices including a stepped buffer dielectric layer and lacking a buffer dielectric layer.

With reference to FIG. 7, device structures in the form of extended-drain metal-oxide-semiconductor devices including a stepped buffer dielectric layer (lower curve) and lacking a buffer dielectric layer (upper curve) were fabricated in which other device features were substantially identical. The drain current was measured periodically over a five-day period for each device structure under stress conditions with the drain biased at 0.1 volts, the gate biased at a positive supply voltage (Vdd), and the source and body grounded. The device structure including the buffer dielectric layer exhibited a reduced Idlin degradation, as indicated by the single-headed arrow, because of the presence of the stepped buffer dielectric layer. This improvement is indicative of an improvement in device reliability.

The methods as described above are used in the fabrication of integrated circuit chips. The resulting integrated circuit chips can be distributed by the fabricator in raw wafer form (e.g., as a single wafer that has multiple unpackaged chips), as a bare die, or in a packaged form. In the latter case, the chip is mounted in a single chip package (e.g., a plastic carrier, with leads that are affixed to a motherboard or other higher level carrier) or in a multichip package (e.g., a ceramic carrier that has either or both surface interconnections or buried interconnections). In any case, the chip may be integrated with other chips, discrete circuit elements, and/or other signal processing devices as part of either an intermediate product or an end product.

References herein to terms such as "vertical", "horizontal", etc. are made by way of example, and not by way of limitation, to establish a frame of reference. The term "horizontal" as used herein is defined as a plane parallel to a conventional plane of a semiconductor substrate, regardless of its actual three-dimensional spatial orientation. The terms "vertical" and "normal" refer to a direction perpendicular to the horizontal, as just defined. The term "lateral" refers to a direction within the horizontal plane.

References herein to terms modified by language of approximation, such as "about", "approximately", and "substantially", are not to be limited to the precise value specified. The language of approximation may correspond to the precision of an instrument used to measure the value and, unless otherwise dependent on the precision of the instrument, may indicate +/−10% of the stated value(s).

A feature "connected" or "coupled" to or with another feature may be directly connected or coupled to or with the other feature or, instead, one or more intervening features may be present. A feature may be "directly connected" or "directly coupled" to or with another feature if intervening features are absent. A feature may be "indirectly connected" or "indirectly coupled" to or with another feature if at least one intervening feature is present. A feature "on" or "contacting" another feature may be directly on or in direct contact with the other feature or, instead, one or more intervening features may be present. A feature may be "directly on" or in "direct contact" with another feature if intervening features are absent. A feature may be "indirectly on" or in "indirect contact" with another feature if at least one intervening feature is present.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A structure for an extended-drain metal-oxide-semiconductor device, the structure comprising:
   a substrate;
   a first source/drain region and a second source/drain region in the substrate;
   a gate electrode over the substrate, the gate electrode having a sidewall, and the gate electrode laterally positioned between the first source/drain region and the second source/drain region; and
   a buffer dielectric layer including a first dielectric layer with a side surface, the first dielectric layer having a first portion positioned between the substrate and the gate electrode, the first dielectric layer having a second portion positioned on the substrate laterally between the sidewall of the gate electrode and the first source/drain region, the first dielectric layer having a third portion positioned on the substrate laterally between the second portion of the first dielectric layer and the side surface, the first portion of the first dielectric layer having a first thickness, the second portion of the first dielectric layer having a second thickness that is less than the first thickness, and the third portion of the first dielectric layer having a third thickness that is less than the second thickness.

2. The structure of claim 1 further comprising:
   a first bilayer spacer positioned on the third portion of the first dielectric layer.

3. The structure of claim 2 wherein the first dielectric layer includes a fourth portion positioned on the substrate laterally between the third portion of the first dielectric layer and the side surface.

4. The structure of claim 2 wherein the first bilayer spacer includes a second dielectric layer with a section on the third portion of the first dielectric layer, and the buffer dielectric layer includes the section of the second dielectric layer.

5. The structure of claim 4 wherein the first dielectric layer and the second dielectric layer are comprised of silicon dioxide.

6. The structure of claim 4 further comprising:
   a second bilayer spacer positioned on the second portion of the first dielectric layer.

7. The structure of claim 6 wherein the second bilayer spacer includes a third dielectric layer with a section on the second portion of the first dielectric layer, and the buffer dielectric layer includes the section of the third dielectric layer.

8. The structure of claim 7 wherein the first dielectric layer, the second dielectric layer, and the third dielectric layer are comprised of silicon dioxide.

9. The structure of claim 1 further comprising:
   a bilayer spacer positioned on the second portion of the first dielectric layer.

10. The structure of claim 9 wherein the bilayer spacer includes a second dielectric layer with a section on the second portion of the first dielectric layer, and the buffer dielectric layer includes the section of the second dielectric layer.

11. The structure of claim 10 wherein the first dielectric layer and the second dielectric layer are comprised of silicon dioxide.

12. The structure of claim 1 further comprising:
   a gate dielectric layer positioned between the gate electrode and the first portion of the first dielectric layer.

13. The structure of claim 1 wherein the first source/drain region is a drain of the extended-drain metal-oxide-semiconductor device.

14. The structure of claim 1 further comprising:
   a first well in the substrate; and
   a second well in the substrate,
   wherein the first source/drain region is positioned in the first well, the second source/drain region is positioned in the second well, the first source/drain region, the second source/drain region, and the first well are doped to a first conductivity type, and the second well is doped to have a second conductivity type of opposite polarity to the first conductivity type.

15. A method of forming a structure for an extended-drain metal-oxide-semiconductor device, the method comprising:
   forming a first source/drain region and a second source/drain region in a substrate;
   forming a gate electrode over the substrate, wherein the gate electrode has a sidewall, and the gate electrode is laterally positioned between the first source/drain region and the second source/drain region; and
   forming a buffer dielectric layer including a first dielectric layer with a side surface, wherein the first dielectric layer has a first portion positioned between the substrate and the gate electrode, the first dielectric layer has a second portion of the first dielectric layer positioned on the substrate laterally between the sidewall of the gate electrode and the first source/drain region, the first dielectric layer has a third portion positioned on the substrate laterally between the second portion of the first dielectric layer and the side surface, the first portion of the first dielectric layer has a first thickness, the second portion of the first dielectric layer has a second thickness that is less than the first thickness, and the third portion of the first dielectric layer has a third thickness that is less than the second thickness.

16. The method of claim 15 wherein forming the buffer dielectric layer including the first dielectric layer with the side surface further comprises:

forming the first dielectric layer; and thinning the third portion of the first dielectric layer to provide the third thickness.

17. The method of claim 15 further comprising:

forming a first bilayer spacer positioned on the second portion of the first dielectric layer; and forming a second bilayer spacer positioned on the third portion of the first dielectric layer.

18. The method of claim 15 further comprising:

forming a bilayer spacer positioned on the second portion of the first dielectric layer, wherein the bilayer spacer includes a second dielectric layer having a section positioned on the second portion of the first dielectric layer.

19. The method of claim 18 wherein the buffer dielectric layer includes the section of the second dielectric layer, and the first dielectric layer and the second dielectric layer are comprised of silicon dioxide.

20. The method of claim 15 wherein forming the buffer dielectric layer including the first dielectric layer with the side surface further comprises:

forming the first dielectric layer; and thinning the second portion of the first dielectric layer to provide the second thickness.

* * * * *